(12) United States Patent
Tung et al.

(10) Patent No.: US 9,349,607 B1
(45) Date of Patent: May 24, 2016

(54) METHOD OF FORMING LINE PATTERN

(71) Applicant: UNITED MICROELECTRONICS CORP., Hsin-Chu (TW)

(72) Inventors: Yu-Cheng Tung, Kaohsiung (TW); En-Chiuan Liou, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/792,630

(22) Filed: Jul. 7, 2015

(51) Int. Cl.
*H01L 21/027* (2006.01)
*H01L 21/311* (2006.01)
*H01L 21/02* (2006.01)

(52) U.S. Cl.
CPC ...... *H01L 21/31144* (2013.01); *H01L 21/0273* (2013.01); *H01L 21/02118* (2013.01); *H01L 21/02345* (2013.01)

(58) Field of Classification Search
CPC .......... H01L 21/02118; H01L 21/02345; H01L 21/0273; H01L 21/31144
See application file for complete search history.

(56) References Cited

U.S. PATENT DOCUMENTS

| | | | |
|---|---|---|---|
| 8,894,869 B2 | 11/2014 | Chang et al. | |
| 8,906,802 B2 | 12/2014 | Wahl et al. | |
| 9,040,429 B2 | 5/2015 | Kato | |
| 2013/0273330 A1* | 10/2013 | Wang | B81C 1/0038 428/172 |
| 2014/0377965 A1 | 12/2014 | Schmid et al. | |

FOREIGN PATENT DOCUMENTS

WO 2014150670 9/2014

OTHER PUBLICATIONS

Guerrero et al., Multifunctional hardmask neutral layer for directed self-assembly (DSA) patterning, 2013.

* cited by examiner

*Primary Examiner* — Daniel Shook
(74) *Attorney, Agent, or Firm* — Winston Hsu; Scott Margo

(57) ABSTRACT

A method of forming a line pattern including following steps. First of all, a substrate having a first region and a second region is provided. Next, a directed self-assembly (DSA) material layer is formed on the substrate, covering the first region and the second region. Then, the DSA material layer in the second region is removed, to form a patterned DSA material layer. After these, an annealing process is performed to enable only the DSA material layer in the first region and to form a plurality of first stripe structures and a plurality of second stripe structures arranged alternately in a first direction.

20 Claims, 7 Drawing Sheets

METHOD OF FORMING LINE PATTERN

BACKGROUND OF THE INVENTION

1. Field of the Invention

The invention relates to a method of forming a line pattern, and more particularly, to a method of forming a line pattern through a directed self-assembly (DSA) process.

2. Description of the Prior Art

Conventional lithography techniques used in the fabrication of semiconductor devices include the double patterning technique by argon fluoride (ArF) immersion exposure, extreme ultraviolet (EUV) lithography, and nano imprints. However, as the size of semiconductor devices is continuously shrunk, such conventional lithography techniques face more limitations in the fabricating process, such as increased costs and decreased throughput caused by the refinement of patterns.

Under such microminiaturized demands, application of directed self-assembly (DSA) materials to lithography techniques is expected. Since directed self-assembly is generated by spontaneous energy stability, this enables the formation of patterns with high dimensional accuracy. Especially for technologies using microphase separation of macromolecule block copolymer, periodic structures up to several hundred nanometers (nm) of various shapes may be formed with a simple coating and annealing process. Depending on the composition ratio of the macromolecule block copolymer, spherical shapes, cylindrical shapes, or lamellar shapes may be formed by changing the sizes based on the molecular weight, and a dot pattern, hole or pillar pattern, or a line pattern of various dimensions may be formed on a substrate.

SUMMARY OF THE INVENTION

It is one of the primary objectives of the present invention to provide a method of forming a line pattern, in which, a directed self-assembly process is used to form desired patterns with fine pitch.

To achieve the purpose described above, one embodiment of the present invention provides a method of forming a line pattern including following steps. First of all, a substrate having a first region and a second region is provided. Next, a directed self-assembly (DSA) material layer is formed on the substrate, covering the first region and the second region. Then, the DSA material layer in the second region is removed. After these, an annealing process is performed to enable only the DSA material layer in the first region and to form a plurality of first stripe structures and a plurality of second stripe structures arranged alternately in a first direction.

To achieve the purpose described above, another embodiment of the present invention provides a method of forming a line pattern including following steps. First of all, a substrate having a first region and a second region is provided. Next, a directed self-assembly (DSA) material layer is formed on the substrate, covering the first region and the second region. Then, the DSA material layer in the second region is hardened. After these, an annealing process is performed to enable only the DSA material layer in the first region and to form a plurality of first stripe structures and a plurality of second stripe structures arranged alternately in a first direction.

The method of forming a line pattern of the present invention conducts a method of using the patterning process of the DSA material layer to confine the arranged direction thereof. In this way, the arranged direction of the separated neutral co-polymer materials in the DSA material layer may be defined fully based on the patterning direction and the condition of the annealing process, thereby forming the DSA material layer having the first stripe structures and the second stripe structures arranged alternately along the patterning direction. Also, in some situations, the arranged direction of the separated neutral co-polymer materials in the DSA material layer may also be guided under the assisting of other sacrificial layers, such as a photoresist layer, a spacer layer or a hardened DSA material layer. By using the aforementioned approaches, it may be desirable to form diverse line pattern through an easier and time-saving process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
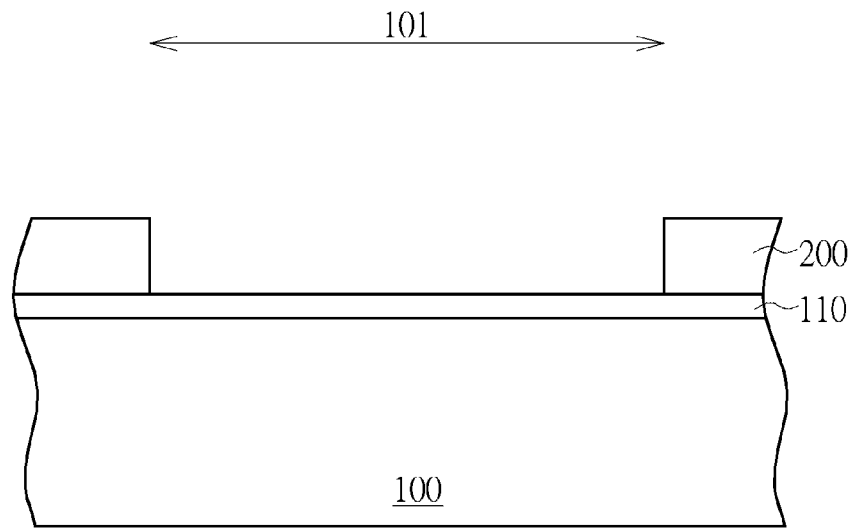
FIG. 1 to FIG. 3 are schematic diagrams illustrating a method of forming a line pattern according to a first embodiment of the present invention.
Figure 2:
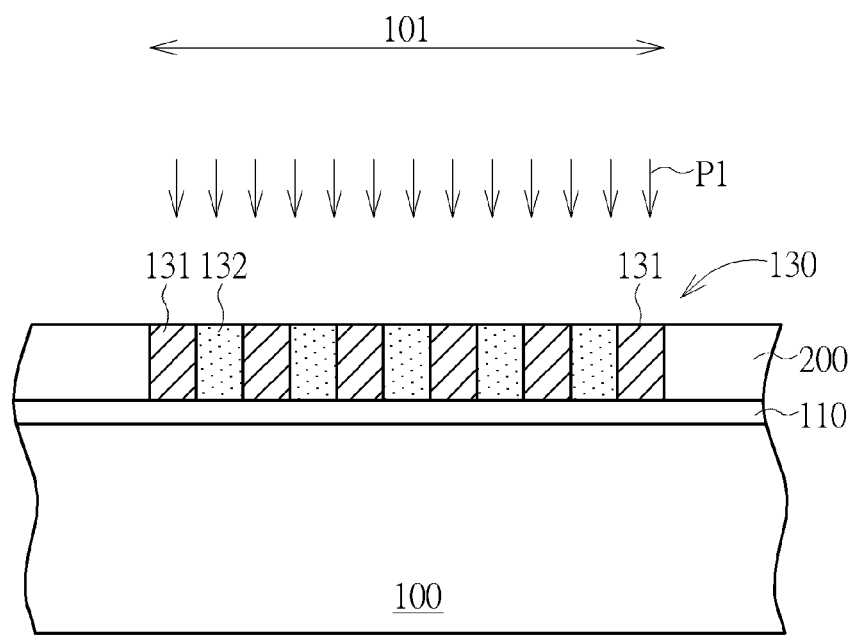
Figure 3:
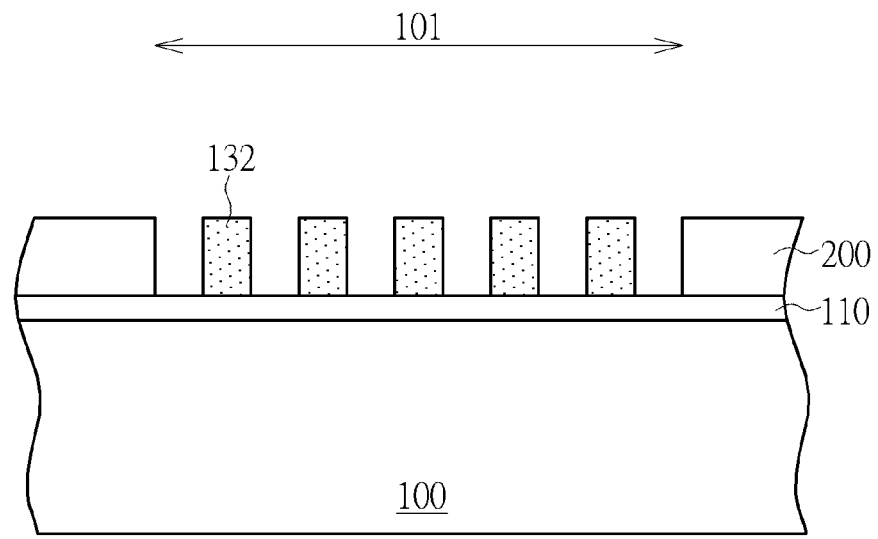

Please refer to FIG. 1 to FIG. 3, which illustrate a method of forming a line pattern according to the first embodiment of the present invention. Firstly, as shown in FIG. 1, a substrate 100 is provided, which may include a semiconductor substrate, such as a silicon substrate, a silicon-containing substrate or a silicon-on-insulator (SOI) substrate, but is not limited thereto. Next, a patterned photoresist layer 200 extending along an x direction or a y direction (being perpendicular to the x direction) is formed on the substrate 100, to expose a region 101 of the substrate 100, as shown in FIG. 1.

In one embodiment, the patterned photoresist layer 200 may include nitride, oxide or oxynitride, and the formation thereof may include firstly forming a photoresist material layer (not shown in the drawings) covering on the entire substrate 100, for example through a chemical vapor deposition (CVD) process, an atomic layer deposition (ALD) process or a physical vapor deposition (PVD) process, and performing an etching process, for example, a dry etching process, a wet etching process or a sequentially performed dry and wet etching process, to remove the photoresist material layer disposed on the region 101 of the substrate 100. In another embodiment, a base layer 110 as shown in FIG. 1 may be optionally formed on the substrate 100 before the patterned photoresist layer 200 is formed and also through a chemical vapor deposition process, an atomic layer deposition process or a physical vapor deposition process, wherein the base layer 110 may include any mask material, such as silicon oxide, silicon nitride or silicon oxynitride, so that, the base layer 110 may function like a hard mask in the subsequent etching process.

Then, a directed self-assembly (DSA) process is performed to form a DSA layer 130, as shown in FIG. 2. Precisely speaking, a DSA material layer (not shown in the drawing) is formed on the entire substrate 100 at first, for example through a spin coating process, and an etching back process is carried out to remove the DSA material layer outside the region 101 of the substrate 100, thereby keeping the DSA material layer only in the region 101. In one embodiment, the DSA material layer is preferably level with the patterned photoresist layer 200, as shown in FIG. 2, but is not limited thereto. In another embodiment, a DSA material layer (not shown in the drawings) having a top surface relatively lower than that of the patterned photoresist layer 200 may be formed optionally. Also, in another embodiment, the DSA material layer may include neutral co-polymer materials, such as poly-styrele (PS), polymethyl meth acrylate (PMMA) and silicon dioxide ($SiO_2$), but is not limited thereto.

After that, an annealing process P1 is carried out to anneal the DSA material layer. In one embodiment, the annealing process P1 may be performed through a solvent annealing at about room temperature to 300° C., for about 5 minutes to 2 hours. In this way, a phase separation may occur in the DSA material layer, so as to form the DSA layer 130 having a plurality of first stripe structures 131 and a plurality of second stripe structures 132 arranged alternately along the extending direction (namely, the x direction or the y direction) of the patterned photoresist layer 200, as shown in FIG. 2. In other words, the neutral co-polymer materials (including PS, PMMA, and $SiO_2$) enable to separate along the extending direction of the patterned photoresist layer 200 during the annealing process P1, thereby forming the first stripe structures 131 and second stripe structures 132 having high etching selectivity. In one embodiment, the first stripe structures 131 may include PS stripes, and the second stripe structures 132 may include PMMA stripes, but are not limited thereto.

Finally, as shown in FIG. 3, an etching process is performed to selectively remove all of the first stripe structures 131, and to only keep the second stripe structures 132 on the region 101 of the substrate 100, due to the high etching selectivity therebetween. Then, the second stripe structures 132 may be used as a mask in the subsequent etching process, to form a plurality of trenches (not shown in the drawings) and a plurality of fin shaped structures (not shown in the drawings) in the region 101 of the substrate 100. However, the formation of the trenches and the fin shaped structures are not limited to the aforementioned process, in the embodiment having the base layer 110 as shown in FIG. 3, patterns of the second stripe structures 132 may be firstly transferred to the base layer 110, and after removing the second stripe structures 132, the patterned base layer 110 is then used as a mask to etch the region 101 of the substrate 100.

Through the above steps, the method of forming a line pattern according to the first embodiment of the present invention is completed. In the present embodiment, the patterned photoresist layer is firstly provided to confine the respective DSA material layer, thereby guiding the arranged direction of the separated neutral co-polymer materials, such as PS, PMMA and $SiO_2$ along the extending direction of the patterned photoresist layer during the annealing process. Thus, the DSA material layer having the first stripe structures and the second stripe structures arranged alternately along the extending direction of the patterned photoresist layer may be obtained in the present embodiment.

However, in some situation, such patterned photoresist layer may cause detrimental effects, such as poor regularity or limited orientation, to desired line patterns, thereby obtaining layout with poor arranged line patterns. Thus, the following description will detail the different embodiments of the method of forming a line pattern of the present invention. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIG. 4 to FIG. 8 are schematic diagrams illustrating a method of forming a line pattern according to the second embodiment of the present invention. The formal steps in the present embodiment are substantially similar to those shown in FIG. 1 of the first embodiment, including providing a substrate 100. The differences between the present embodiment and the aforementioned first embodiment are in that, the substrate 100 includes a first region 103 and a second region 102, a DSA material layer 150 is formed on the substrate 100, covering the first region 103 and the second region 102 of the substrate 100, and a hard mask layer 170 and a patterned photoresist layer 400 extended along the x direction or the y direction are sequentially formed on the DSA material layer 150.

Figure 4:
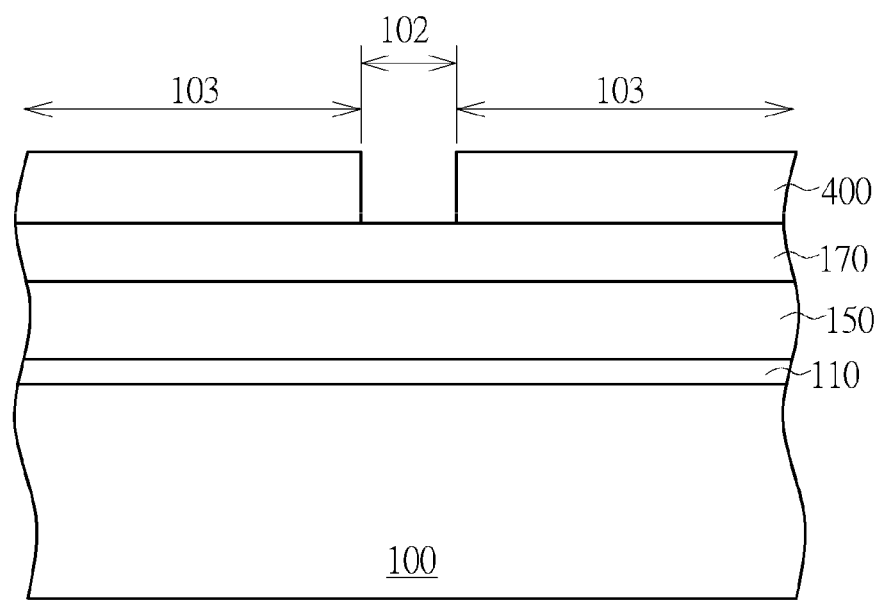
FIG. 4 to FIG. 8 are schematic diagrams illustrating a method of forming a line pattern according to a second embodiment of the present invention.

Please note that, in the present embodiment, the patterned photoresist layer 400 only covers the first region 103 of the substrate 100, so that, the second region 102 of the substrate 100 may be exposed accordingly, as shown in FIG. 4. Also, detailed materials and forming method of the patterned photoresist layer 400 are all similar to the patterned photoresist layer 200 of the first embodiment, and will not be further described herein. However, the patterned photoresist layer 400 is not limited thereto, and in another embodiment, a patterned photoresist layer extending in other directions, covering other regions, or including other materials may also be provided. Also, in another embodiment, the hard mask layer 170 may also be omitted.

Figure 5:
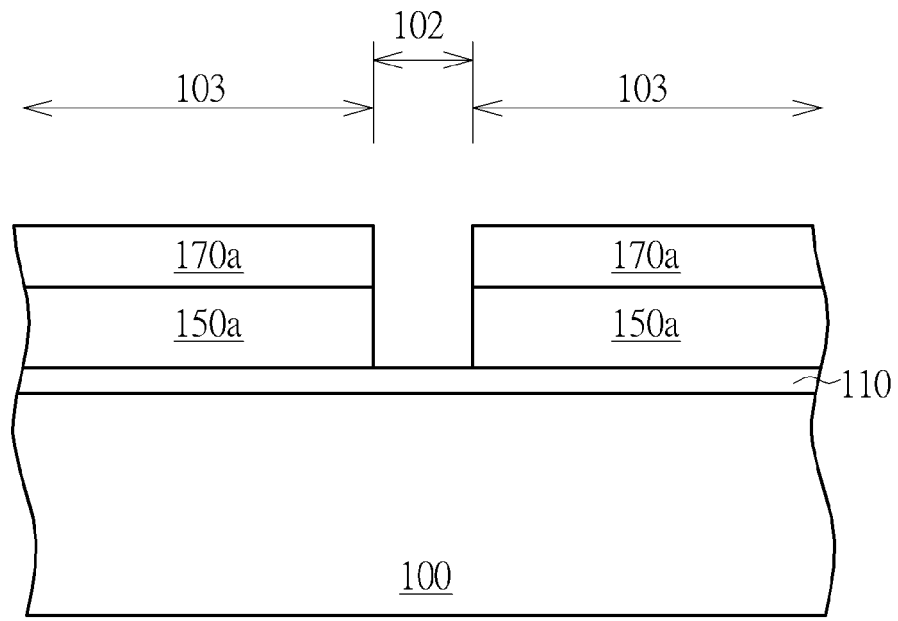

Then, as shown in FIG. 5, an etching process, such as a dry etching process, a wet etching process, or a sequentially performed dry and wet etching process, is performed to remove the DSA material layer 150 in the second region 102, and to form a DSA material layer 150a extended along the x direction or the y direction and only covering the first region 103 of the substrate 100. In one embodiment, the patterns of the patterned photoresist layer 400 are firstly transferred to the hard mask layer 170 underneath, to form a patterned hard mask layer 170a, and then, the patterned photoresist layer 400 is removed and the etching process is performed by using the patterned hard mask layer 170a as a mask, as shown in FIG. 5. However, the formation of the DSA material layer 150a is not limited to the aforementioned processes, and may include other forming methods. For example, in another embodiment, the DSA material layer 150a may also be formed by directly transferring the patterns of the patterned photoresist layer 400 to the hard mask layer 170 and the DSA material layer 150, so as to form the patterned hard mask layer 170a and the DSA material layer 150a simultaneously; or in the embodiment of omitting the hard mask layer 170, the DSA material layer 150a may also be formed by directly using the patterned photoresist layer 400 as a mask.

Figure 6:
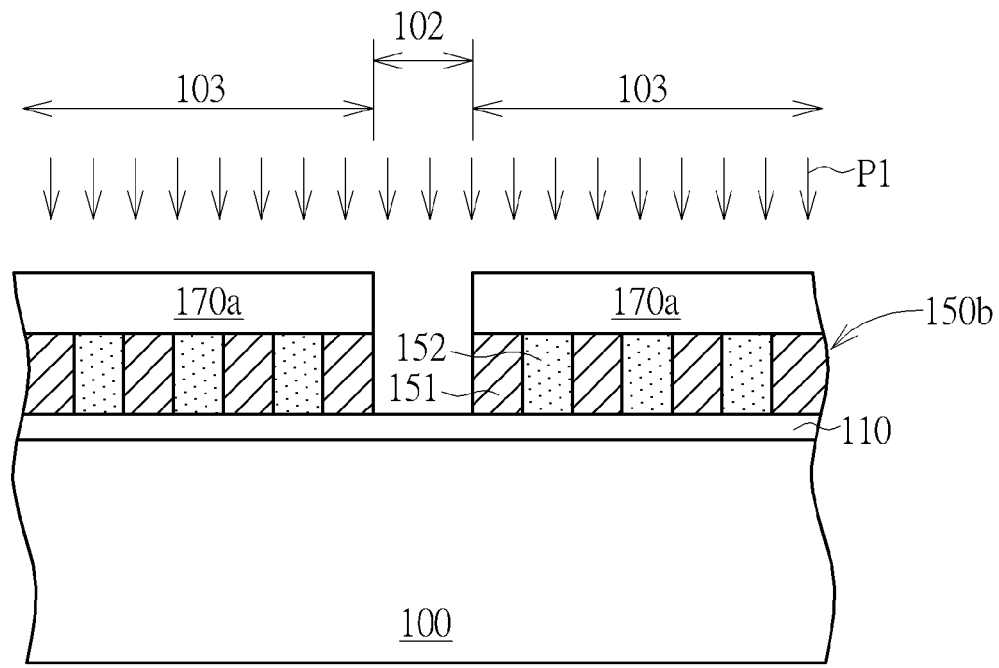

Following these, the annealing process P1 is carried out to anneal the DSA material layer 150a, thereby forming a DSA layer 150b having a plurality of first stripe structures 151 and second stripe structures 152 having high etching selectivity, as shown in FIG. 6. Then, the patterned hard mask layer 170*a* is removed. Please note that, in the present embodiment, the annealing process P1 is performed while the patterned hard mask layer 170*a* remains on the DSA material layer 150*a*, so that the patterned hard mask layer 170*a* may function like a buffering layer during the annealing process P1, but is not limited thereto. In another embodiment, the patterned hard mask layer 170*a* may also be removed right after the DSA material layer 150*a* is formed, and then, the annealing process P1 may be performed without the buffering of the patterned hard mask layer 170*a*. It is also noted that, the detailed conditions of the annealing process P1 are substantially similar to that of the aforementioned first embodiment, and will not be further detailed herein.

It is worth of noting that, in a preferably embodiment, a pre-annealing process (not shown in the drawings), for example, a lateral annealing process, may be performed before the annealing process, also at about room temperature to 300° C. but for a relative short period, such as 10 seconds to 5 minutes, so as to firstly anneal two patterned sides of the DSA material layer 150*a*. Thus, a phase separation may firstly occur at an area adjacent to the two patterned sides of the DSA material layer 150*a*, thereby forming first stripe structures (not shown in the drawings) or second stripe structures (not shown in the drawings) at two patterned sides of the DSA material layer 150*a* previously. In this way, while the annealing process is performed, the neutral co-polymer materials in the rest part of the DSA material layer 150 may enable to separate along the previously formed first stripe structures or the second stripe structures. Namely, the annealing process P1 of the present embodiment may be performed by using the previously formed first stripe structures or the second stripe structures as a natural guide, but is not limited thereto.

Figure 7:
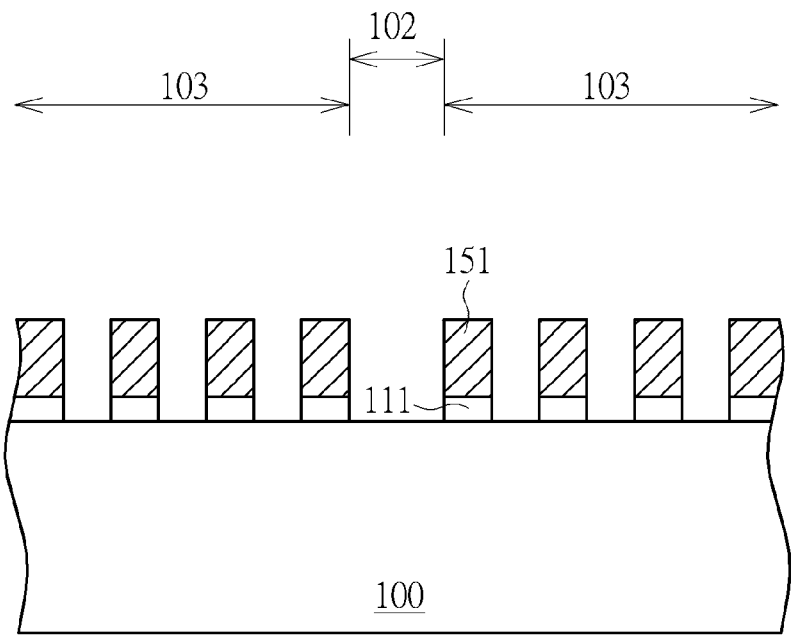
Figure 8:
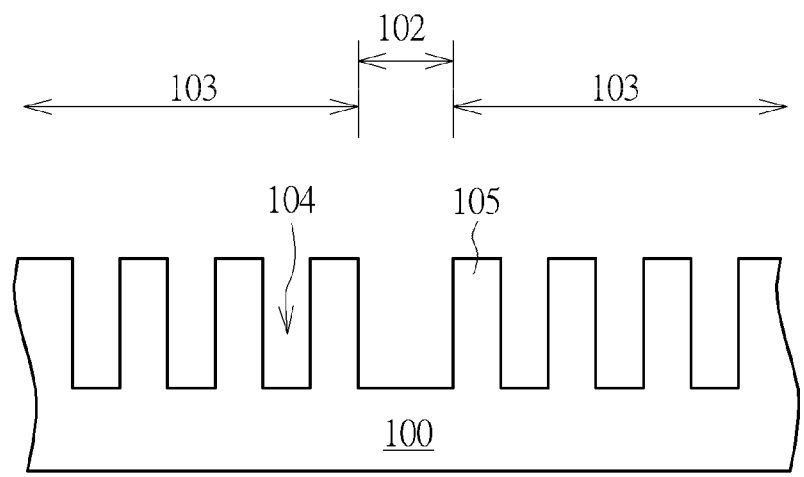

Finally, as shown in FIG. 7 and FIG. 8, an etching process is performed to remove all of the second stripe structures 152, and to only keep the first stripe structures 151 on the first region 103 of the substrate 100, due to the high etching selectivity therebetween. Then, the first stripe structures 151 may be used as a mask in the following etching process, to form a plurality of trenches 104, as shown in FIG. 8. In this way, a plurality of fin shaped structures 105 may also be defined in the first region 103 of the substrate 100 accordingly. However, the formation of the trenches and the fin shaped structures is not limited to the aforementioned process, in the embodiment having the base layer 110, patterns of the first stripe structures 151 may be firstly transferred to the base layer 110 to form patterned base layer 111 as shown in FIG. 7, and after removing the first stripe structures 151, the patterned base layer 111 is then used as a mask to etch the substrate 100. Otherwise, in another embodiment, the fin shaped structure (not shown in the drawings) may also be formed by using the second stripe structures as a mask.

Through the above steps, the method of forming a line pattern according to the second embodiment of the present invention is completed. In the present embodiment, the DSA material layer is formed on the entire substrate, followed by patterning the DSA material layer to confine the arranged direction thereof. In this way, the arranged direction of the separated neutral co-polymer materials, such as PS, PMMA and $SiO_2$ may be defined fully based on the patterning direction and the condition of the annealing process, so that, the DSA layer having the first stripe structures and the second stripe structures arranged alternately along the patterning direction may be obtained in the present embodiment.

Figure 9:
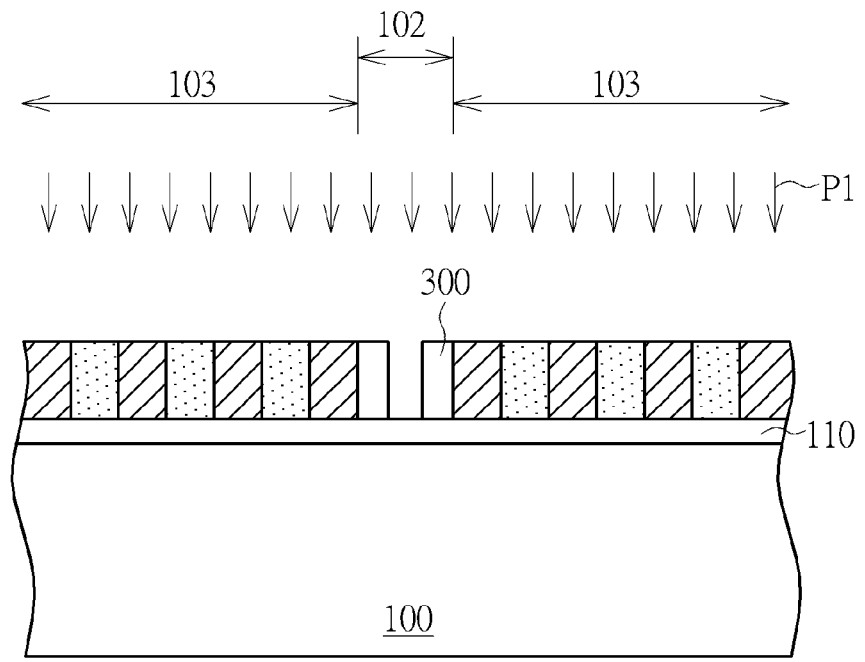
FIG. 9 is schematic diagram illustrating a method of forming a line pattern according to a third embodiment of the present invention.

Please refer to FIG. 9, which is a schematic diagram illustrating a method of forming a line pattern according to the third embodiment of the present invention. The formal steps in the present embodiment are substantially similar to those shown in FIGS. 4-5 and 7-8 of the second embodiment, and the differences between the present embodiment and the aforementioned second embodiment are that, before the annealing process P1 is performed, a spacer layer 300 may be optionally formed adjacent to the DSA material layer 150*a*, as shown in FIG. 9. Precisely, the spacer layer 300 may be formed by firstly forming a spacer material layer (not shown in the drawings) to cover the entire substrate 100 and the DSA material layer 150*a*, and performing an etching process to remove a portion of the spacer material layer, thereby forming the spacer layer 300 shown in FIG. 9. In one embodiment, the spacer layer 300 may include oxide, nitride, oxynitride, or other materials having etching selectivity relative to the substrate 100 and the DSA material layer 150*a*, but is not limited thereto.

It is worth noting that, the spacer layer 300 may be formed at two parallel sides of the DSA material layer 150*a* and extends along the same direction (namely, the x direction or the y direction) to the DSA material layer 150*a*, so that, while performing the annealing process P1, the neutral co-polymer materials in the DSA material layer 150*a* may be separate along the extending direction (namely, the x direction or the y direction) of spacer layer 300, thereby guiding the arranged direction of the separated neutral co-polymer materials. Thus, a DSA layer (not shown in the drawings) having a plurality of first stripe structures (not shown in the drawings) and a plurality of second stripe structures (not shown in the drawings) arranged alternately along the x direction or the y direction may be obtained in the subsequent process of the present embodiment. However, the formation of the spacer layer 300 is not limited to the above-mentioned steps but may include other methods. For example, a spacer layer (not shown in the drawings) may be formed either before or after the patterned hard mask layer 170*a* is removed; or a spacer layer (not shown in the drawings) may be formed to at least surround the entire DSA material layer 150*a*. Thus, in the embodiment of forming the spacer layer surrounding the DSA material layer 150*a*, a pattering process (namely, a spacer cut process, not shown in the drawings) may be additionally performed to remove a portion of the spacer layer extending along the y direction or the x direction, thereby keeping the spacer layer only extending in the x direction or the y direction, for guiding the arranged direction of the separated neutral co-polymer materials in the subsequent annealing process P1.

Through the above steps, the method of forming a line pattern according to the third embodiment of the present invention is completed. Please note that, except for the above mentioned differences, other steps of the present embodiment are all similar to those in the aforementioned second embodiment and will not be further detailed herein. In the present embodiment, the spacer layer is further formed adjacent to the patterned DSA material layer, thereby, assistantly guiding the arranged direction of the separated neutral co-polymer materials in the subsequent annealing process. Thus, the DSA layer having the first stripe structures and the second stripe structures arranged alternately along the extending direction of the spacer layer may be obtained in the present embodiment.

Figure 10:
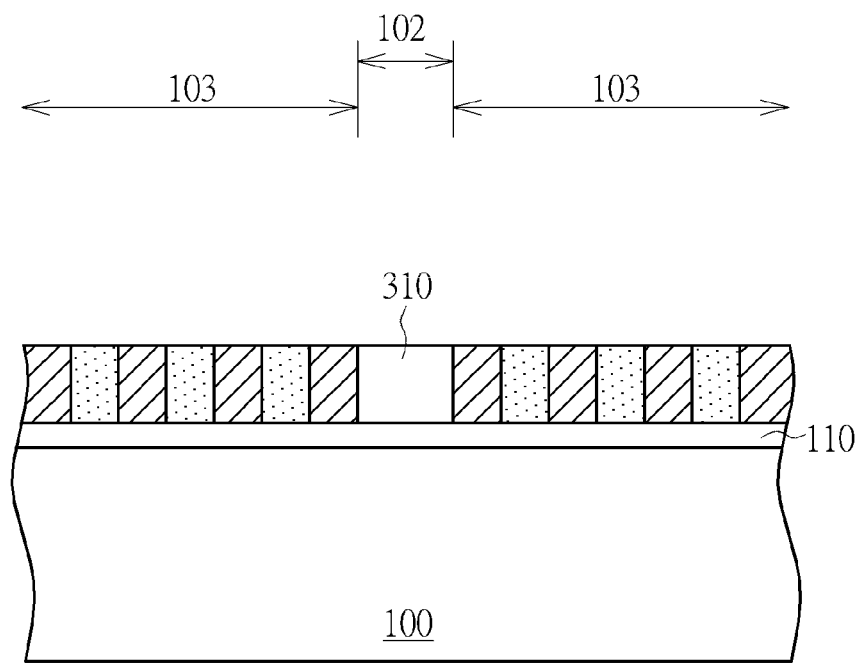
FIG. 10 is schematic diagram illustrating a method of forming a line pattern according to a fourth embodiment of the present invention.

Please refer to FIG. 10, which is a schematic diagram illustrating a method of forming a line pattern according to the fourth embodiment of the present invention. The formal steps in the present embodiment are substantially similar to those shown in the third embodiment, and the differences between the present embodiment and the aforementioned third embodiment are that, before the annealing process P1 is performed, a sacrificial layer 310 may be further formed on the second region 102 of the substrate 100, adjacent to the DSA material layer 150a, as shown in FIG. 10. In one embodiment, the sacrificial layer 310 may include a photoresist layer or a mask layer having etching selectivity relative to the substrate 100 and the DSA material layer 150a, but are not limited thereto.

Please note that, although the sacrificial layer 310 is formed after the patterned hard mask layer 170a is removed in the present embodiment, the formation thereof is not limited thereto, and in another embodiment, a sacrificial layer (not show in the drawings) may also be formed while the patterned hard mask layer 170a remains on the DSA material layer 150a. It is also worth noting that, since the sacrificial layer 310 is formed adjacent to the DSA material layer 150a, it may enable facilitating the neutral co-polymer materials therein to separate along the extending direction of the sacrificial layer 310, thereby guiding the arranged direction of the separated neutral co-polymer materials. Thus, a DSA layer (not shown in the drawings) having a plurality of first stripe structures (not shown in the drawings) and a plurality of second stripe structures (not shown in the drawings) arranged alternately along the extending direction of the sacrificially layer 310 may be obtained in the subsequent process of the present embodiment.

Through the above steps, the method of forming a line pattern according to the fourth embodiment of the present invention is completed. Please note that, except for the above mentioned differences, other steps of the present embodiment are all similar to those in the aforementioned third embodiment and will not be further detailed herein. In the present embodiment, the sacrificial layer is further formed adjacent to the patterned DSA material layer, thereby, assistantly guiding the arranged direction of the separated neutral co-polymer materials in the subsequent annealing process. Thus, the DSA layer having the first stripe structures and the second stripe structures arranged alternately along the extending direction of the sacrificial layer may be obtained in the present embodiment.

Figure 11:
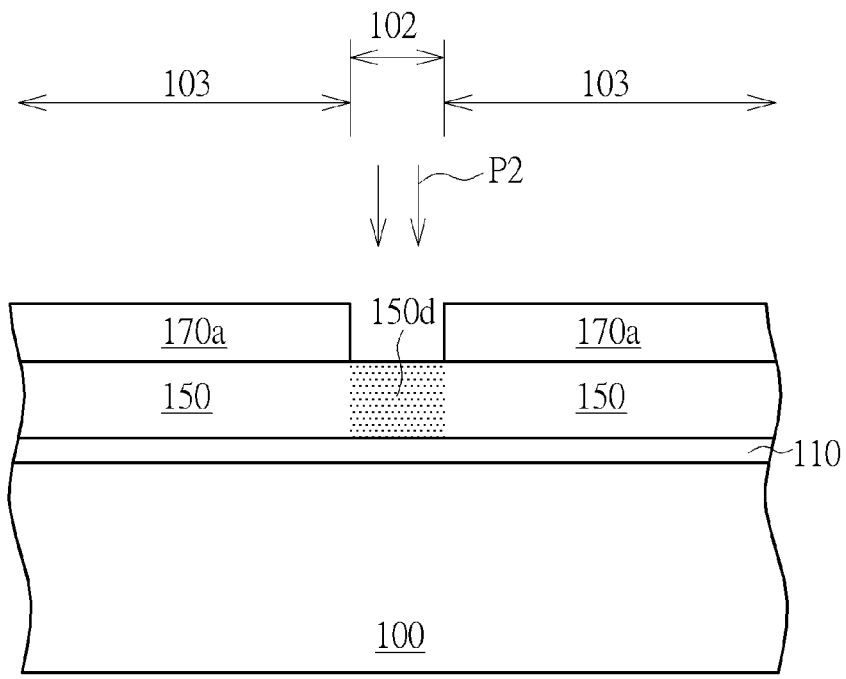
FIG. 11 to FIG. 13 are schematic diagram illustrating a method of forming a line pattern according to a fifth embodiment of the present invention.
Figure 12:
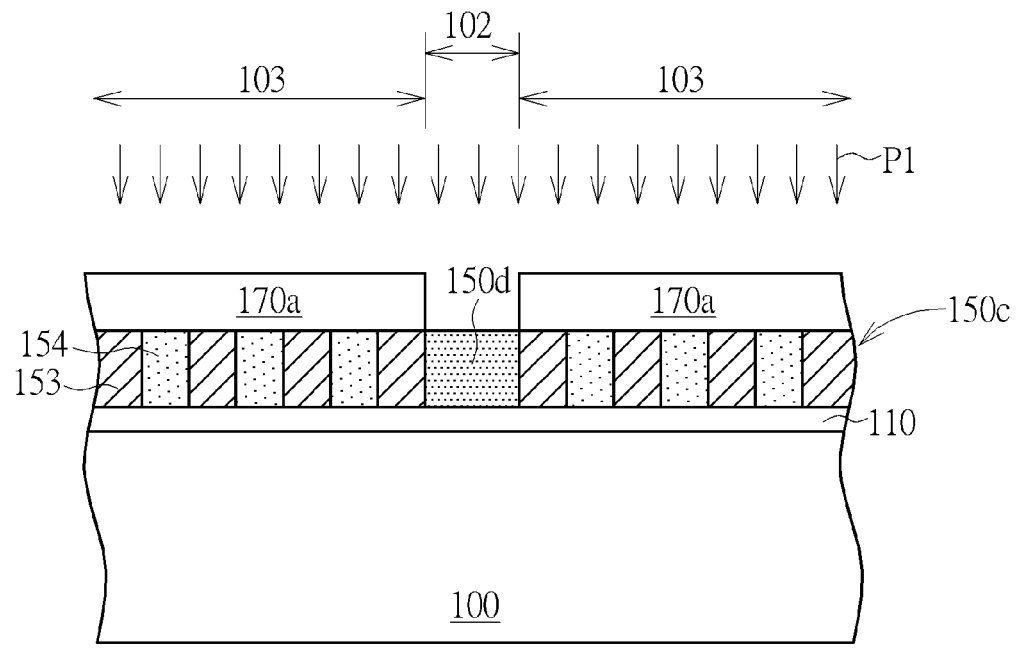
Figure 13:
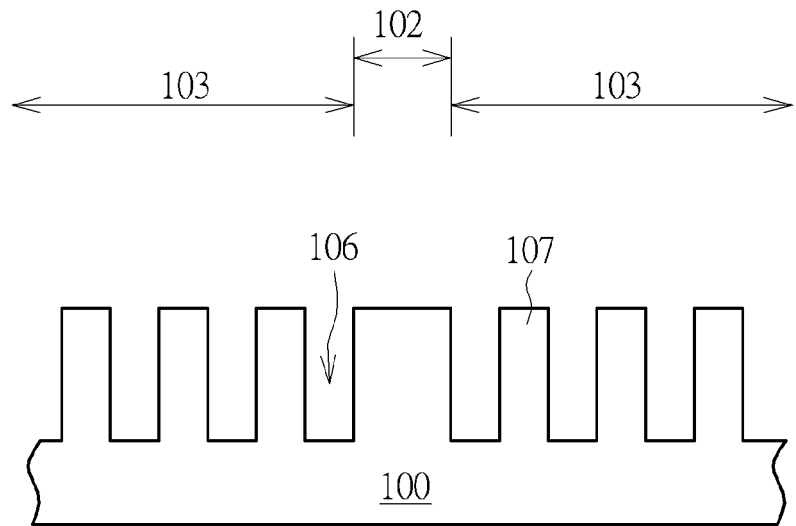

Please refer to FIG. 11 to FIG. 13, which are schematic diagrams illustrating a method of forming a line pattern according to the fifth embodiment of the present invention. The formal steps in the present embodiment are substantially similar to those shown in FIG. 4 of the second embodiment, and the differences between the present embodiment and the aforementioned second embodiment are that, after the patterned hard mask layer 170a is formed, the patterned photoresist layer (not shown in the drawings) is removed and a hardening process P2 is performed by using the patterned hard mask layer 170a as a mask.

Precisely, as shown in FIG. 11, the hardening process P2 is carried out on the exposed portion of the DSA material layer 150 (namely the DSA material layer in the second region 102), for example, through an implantation process or laser radiation process, so that, the second region 102 of the DSA material layer 150 is hardened. After that, the annealing process P1 may be carried out to anneal the DSA material layer 150. It is worth noting that, since the second region 102 of the DSA material layer 150 is hardened, the neutral co-polymer materials therein may be already transformed and prevented from separating during the annealing process P1. In this way, the phase separation may only occur in the first region 103 of the DSA material layer 150 during the annealing process P1, as shown in FIG. 12, thereby forming a DSA layer 150c having a plurality of first stripe structures 153 and a plurality of second stripe structures 154 arranged alternately on the substrate 100.

Then, an etching process is performed to remove all of the first stripe structures 153, and to only keep the second stripe structures 154 on the first region 103 of the substrate 100, due to the high etching selectivity therebetween. Thus, the second stripe structures 154 may be used as a mask in the following etching process, to form a plurality of trenches 106, as shown in FIG. 13. In this way, a plurality of fin shaped structures 107 may also be defined in the first region 103 of the substrate 100 accordingly, as shown in FIG. 13. However, the formation of the trenches 106 and the fin shaped structures 107 is not limited to the aforementioned process. In the embodiment having the base layer 110, patterns of the second stripe structures 154 may be firstly transferred to the base layer 110, and after removing the second stripe structures 154, the patterned base layer 110 is then used as a mask to form the trenches 106 and the fin shaped structures 107.

Through the above steps, the method of forming a line pattern according to the fifth embodiment of the present invention is completed. In the present embodiment, a portion of the DSA material layer is hardened to form a hardened DSA material layer, and then, the hardened DSA material layer is used to confine the arranged direction of the neutral co-polymer in other portion of the DSA material layer, thereby, assistantly guiding the arranged direction of the separated neutral co-polymer materials in the subsequent annealing process.

Figure 14:
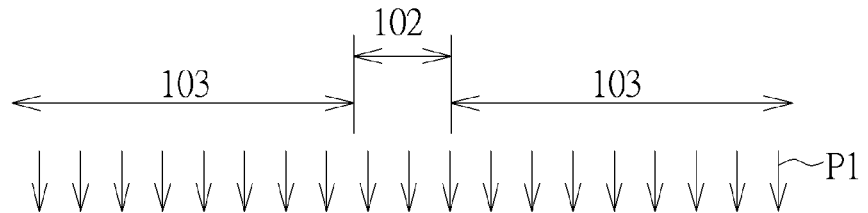
FIG. 14 is a schematic diagram illustrating a method of forming a line pattern according to a sixth embodiment of the present invention.
Figure 14:
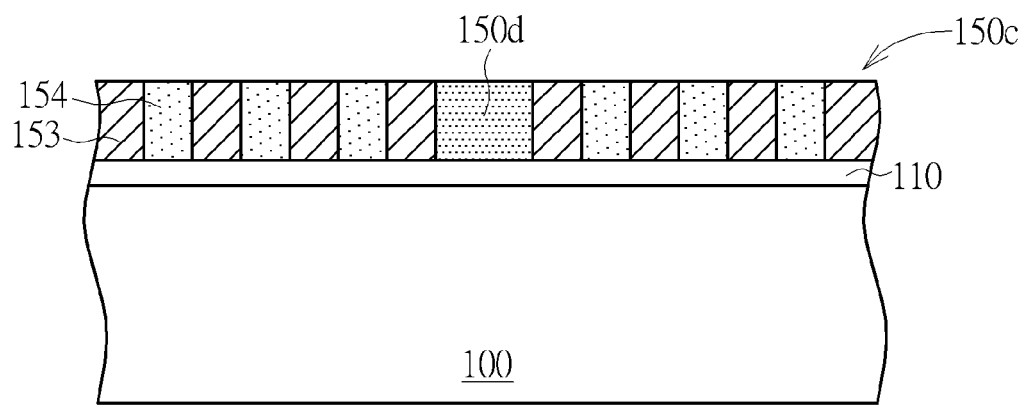

Please refer to FIG. 14, which is a schematic diagram illustrating a method of forming a line pattern according to the sixth embodiment of the present invention. The formal steps in the present embodiment are substantially similar to those shown in FIGS. 11-13 of the fifth embodiment, and the differences between the present embodiment and the aforementioned fifth embodiment are that, the annealing process P1 is carried out after the patterned hard mask layer 170a is removed, as shown in FIG. 14. Except for the above mentioned differences, other steps of the present embodiment are all similar to those in the aforementioned second embodiment and will not be further detailed herein.

It is noted that, although the aforementioned embodiments are all exemplified by using the DSA process to form fin shaped structures, people skilled in the art shall easily realize that the method of the present invention is not limited thereto. In other embodiments, the DSA material layer may also be formed on a target layer, such as a conductive layer, including aluminum (Al), copper (Cu) or tungsten (W); or a non-conductive layer, including dielectric or other insulating material, but is not limited thereto. In this way, the first stripe structures or the second stripe structures may be used to form a wiring structure, a plug structure or other semiconductor devices.

Overall, the present invention preferably conducts a method of using the patterning process of the DSA material layer to confine the arranged direction thereof. In this way, the arranged direction of the separated neutral co-polymer materials in the DSA material layer, such as PS, PMMA and $SiO_2$ may be defined fully based on the patterning direction and the condition of the annealing process, or the assistant guiding of the spacer layer or the sacrificially formed after the DSA material layer is patterned or the hardened portion of the DSA material layer, thereby forming the DSA layer having the first stripe structures and the second stripe structures arranged alternately along the patterning direction. By using the aforementioned approach it may be desirable to form a diverse line pattern through an easier and time-saving process.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of forming a line pattern, comprising:
providing a substrate having a first region and a second region;
forming a directed self-assembly (DSA) material layer on the substrate, covering the first region and the second region;
removing the DSA material layer in the second region, to form a patterned DSA material layer in the first region; and
after forming the patterned DSA material layer, performing an annealing process to enable only the DSA material layer in the first region to form a plurality of first stripe structures and a plurality of second stripe structures arranged alternately in a first direction.

2. The method of forming a line pattern according to claim 1, wherein the removing of the DSA material layer comprises:
forming a photoresist layer to cover the DSA material layer in the first region; and
performing an etching process to remove the DSA material layer in the second region.

3. The method of forming a line pattern according to claim 2, wherein the removing of the DSA material layer comprises:
forming a hard mask layer on the DSA material layer, wherein the photoresist layer is formed on the hard mask layer;
performing the etching process to form a patterned hard mask layer covering the DSA material layer in the first region, before the DSA material layer is removed.

4. The method of forming a line pattern according to claim 3, wherein the patterned hard mask layer is removed after the annealing process.

5. The method of forming a line pattern according to claim 3, wherein the patterned hard mask layer is removed before the annealing process.

6. The method of forming a line pattern according to claim 3, before the annealing process is performed, the method further comprising:
forming a spacer layer on the substrate adjacent to the patterned DSA material layer.

7. The method of forming a line pattern according to claim 6, wherein the spacer layer is formed before the patterned hard mask layer is removed.

8. The method of forming a line pattern according to claim 6, wherein the spacer layer is formed after the patterned hard mask layer is removed.

9. The method of forming a line pattern according to claim 3, before the annealing process is performed, the method further comprising:
forming a spacer layer on the substrate to at least surround the patterned DSA material in the first region; and
removing the spacer layer extended along a second direction perpendicular to the first direction.

10. The method of forming a line pattern according to claim 3, before the annealing process is performed, the method further comprising:
forming a sacrificial layer on the substrate to cover the second region.

11. The method of forming a line pattern according to claim 10, wherein the sacrificial layer is formed before the patterned hard mask layer is removed.

12. The method of forming a line pattern of claim 10, wherein the sacrificial layer is formed after the patterned hard mask layer is removed.

13. The method of forming a line pattern according to claim 1, further comprising:
removing the second stripe structures; and
performing an etching process by using the first stripe structures as a mask.

14. The method of forming a line pattern of claim 1, further comprising:
forming a base layer on the substrate, and the DSA material layer is formed on the base layer.

15. A method of forming a line pattern, comprising:
providing a substrate having a first region and a second region;
forming a directed self-assembly (DSA) material layer on the substrate, covering the first region and the second region;
hardening the DSA material layer in the second region; and
performing an annealing process to enable only the DSA material layer in the first region and to form a plurality of first stripe structures and a plurality of second stripe structures arranged alternately in a first direction.

16. The method of forming a line pattern according to claim 15, wherein the hardening of the DSA material layer is performed through an implantation process or a laser radiation process.

17. The method of forming a line pattern according to claim 15, wherein the hardening of the DSA material layer comprises:
forming a patterned hard mask layer to cover the DSA material layer in the first region.

18. The method of forming a line pattern according to claim 17, wherein the patterned hard mask layer is removed before the annealing process.

19. The method of forming a line pattern according to claim 17, wherein the patterned hard mask layer is removed after the annealing process.

20. The method of forming a line pattern according to claim 15, further comprising:
removing the first stripe structures; and
performing an etching process by using the second stripe structures as a mask.

* * * * *